United States Patent [19]

Ohmi et al.

[11] Patent Number: 5,703,488
[45] Date of Patent: Dec. 30, 1997

[54] INSTRUMENT FOR MEASURING PLASMA EXCITED BY HIGH-FREQUENCY

[75] Inventors: Tadahiro Ohmi, 1-17-301, Komegabakuro 2-chome, Aoba-ku, Miyagi-ken 980; Masaki Hirayama, Miyagi-ken, both of Japan

[73] Assignee: Tadahiro Ohmi, Miyagi-ken, Japan

[21] Appl. No.: 481,285

[22] PCT Filed: Jan. 14, 1994

[86] PCT No.: PCT/JP94/00046

§ 371 Date: Jul. 5, 1995

§ 102(e) Date: Jul. 5, 1995

[87] PCT Pub. No.: WO94/16542

PCT Pub. Date: Jul. 21, 1994

[30] Foreign Application Priority Data

Jan. 15, 1993 [JP] Japan .................. 5-022106

[51] Int. Cl.$^6$ .................. G01N 27/62; G01N 27/66; H05H 1/46
[52] U.S. Cl. .................. 324/464; 324/470; 324/71.1; 315/111.21; 376/143; 436/153
[58] Field of Search .................. 324/71.1, 459, 324/464, 470; 436/153; 376/143; 315/111.21, 111.31; 204/164, 400

[56] References Cited

U.S. PATENT DOCUMENTS 5,140,223 8/1992 Gesche et al. .................. 315/111.21
5,153,519 10/1992 Wentworth et al. .................. 324/464
5,175,472 12/1992 Johnson, Jr. et al. .................. 315/111.21
5,537,004 7/1996 Imahashi et al. .................. 315/111.21

OTHER PUBLICATIONS

Goto et al., "A Low Damage, Low Contaminant Plasma Processing System Utilizing Energy Clean Technology," IEEE Transactions on Semiconductor Manufacturing, pp. 111–121, vol. 4, No. 2, (May 1991).

*Primary Examiner*—Glenn W. Brown
*Attorney, Agent, or Firm*—Marshall, O'Toole, Gerstein, Murray & Borun

[57] ABSTRACT

This instrument can measure parameters of a plasma accurately and easily even though the plasma is exited by a high-frequency. The instrument for measuring parameters of a plasma generated in a vacuum chamber by high-frequency discharge at a given frequency comprises a wire (106) for electrically connecting a first electrode (101) arranged in a space where a plasma is produced and a terminal (110) arranged outside the vacuum chamber for taking out signals, and a first insulator (105) so arranged as to cover at least a part of the surface of the wire therewith. The absolute value of the impedance at the given frequency between the first electrode and the ground when looking into the terminal side from the first electrode is five times or more the absolute value of the impedance at the given frequency between the first electrode and the plasma in a state where no direct current flows through the first electrode.

5 Claims, 15 Drawing Sheets

INSTRUMENT FOR MEASURING PLASMA EXCITED BY HIGH-FREQUENCY

TECHNICAL FIELD

The present invention relates to an instrument for measuring a plasma excited by a high frequency, and relates to an instrument which makes possible the accurate measurement of all parameters of a plasma excited by a high frequency.

BACKGROUND ART

By applying a voltage to an extremely small electrode inserted into a stationary plasma produced by means of direct current discharge, and thus measuring the amount of current flowing from the plasma, it is possible to measure plasma parameters such as the potential, density, electron temperature and the like of the plasma; beginning with the single probe proposed in the 1920's by Langmuir et al, various probes have been employed in plasma measurement, such as the emission probe, which was proposed later and which employed thermoelectrodes, the double probe, which employed two electrodes, and the like. These probes were effective in the measurement of direct current discharge plasma in which the plasma potential did not fluctuate over time; however, when used in the measurement of high frequency discharge plasma, such probes were greatly affected by the excitation frequency of the plasma, and this caused a problem in that the accuracy of measurement of the plasma parameters declined markedly. In addition, it was difficult to obtain accurate information about the film formation atmosphere of, for example, functional thin films, or the like, and this constituted a great hindrance to the development of high quality functional thin films.

The present invention has as an object thereof to provide an instrument for measuring plasma which is capable of accurately and simply measuring all parameters of plasma, not only in direct current discharge plasma, but also in high frequency discharge plasma.

DISCLOSURE OF THE INVENTION

The measuring instrument for plasma excited by high frequencies in accordance with the present invention is a measuring instrument for measuring all values of a plasma produced within a vacuum chamber by means of a high frequency discharge having a given frequency, characterized in comprising a wire for electrically connecting a first electrode disposed within a plasma and a terminal provided outside the vacuum chamber which serves to take out signals, and a first insulator which is provided so as to cover at least a portion of the surface of the wire, and in that the absolute value of the impedance at the given frequency between the first electrode and the ground when looking into the terminal side from the first electrode is 5 times or more the absolute value of the impedance at the given frequency between the first electrode and the plasma in a state in which no direct current flows through the first electrode.

It is preferable that a second electrode be disposed within the plasma, and that the second electrode and the first electrode be connected via a capacitor.

Furthermore, it is preferable that the impedance between the terminal and the ground when looking into the side opposite the first electrode from the terminal, at the given frequency, be made variable.

Furthermore, it is preferable that at least a portion of the wire comprises a coaxial cable, that the length of the outer conductor of this coaxial cable be approximately equivalent to an odd multiple of ¼ the wavelength within the coaxial cable at the given frequency, and that the core and the outer conductor of the coaxial cable be provided via a capacitor at the terminal side end of the coaxial cable.

Additionally, it is preferable that at least a portion of the wire comprise a coaxial cable, that a resistor be provided between the first electrode and the core of the coaxial cable, and that a measuring instrument which is capable of measuring the high frequency voltage of the terminal at the given frequency be provided.

Function

Hereinbelow, the function of the present invention will be explained on the basis of experiments which were conducted in the process of arriving at the present invention.

FIG. 12 shows the results of the measurement of a direct current discharge plasma and a high frequency discharge plasma using a conventional single probe. The horizontal axis indicates the voltage applied to the probe electrode, the left hand vertical axis indicates the current value of the probe electrode, and the right hand vertical axis indicates the electron current value. The solid and dotted lines indicate the results of the measurement with respect to, respectively, the direct current discharge plasma and the high frequency discharge plasma. Here, by measuring the ion energy present in the plasma using an ion energy analyzer, the discharge conditions were set so that the plasma potential of both the direct current discharge plasma and the high frequency discharge plasma were identical, and the plasma was produced.

It was learned that, as shown in FIG. 12, the current/voltage characteristics of the direct current discharge plasma and the high frequency discharge plasma differed completely. In the direct current discharge plasma, the plasma potential, for example, as obtained from the current voltage characteristics agreed well with the value obtained from the ion energy. In contrast, in the high frequency discharge plasma, the average plasma potential value was 34 V lower than the actual value, and the observed plasma density was only ⅓ of that expected.

This is thought to occur for the following reasons. In the high frequency discharge plasma, the plasma potential fluctuates greatly with the excitation frequency. The potential of a probe electrode which is inserted into such a plasma also fluctuates with the excitation frequency; however, the amplitude and phase of the potential of the electrode was different in conventional probes from the amplitude and phase of the plasma potential. The potential of the probe electrode was determined by the impedance of a sheath provided around the electrode and the impedance of the probe itself, and the amount of current flowing in the probe electrode depended on the difference between the plasma potential and the potential of the probe electrode, so that the current value of the probe also varied with the excitation frequency. As a result, the dependency of the average value of the probe current with respect to the potential of the probe electrode differed completely from that in the case of a direct current discharge plasma, as shown in FIG. 12, and it was thus difficult to accurately extract the parameters such as the plasma potential, density, electron temperature, and the like. Accordingly, it was determined that in order to obtain current voltage characteristics identical to those of the direct current discharge plasma, the probe electrode potential should be made to oscillate in such a manner as to be parallel to and synchronous with the plasma potential. It was determined that for this reason, it was necessary to set the impedance of the probe so as to be sufficiently larger than the impedance of the sheath. Next, the relationship between the probe impedance and the sheath impedance will be explained.

FIG. 13 shows how the measured values of the plasma potential (solid line) and electron density (dotted line) vary with respect to the susceptance of the probe itself. The probe which was used in the measurements had a variable susceptance at the excitation frequency, and the loss thereof was sufficiently small, so that the resistance component of the electrode could be ignored. The actual plasma potential and electron density were equivalent to the measured values in the case in which the susceptance was 0, that is to say, the impedance (in actuality, the reactance) was infinitely large. It can be seen from FIG. 13 that whether the probe is capacitive (the susceptance is positive) or inductive (the susceptance is negative) the accurate measurement of the plasma parameters is possible only in the region in which the susceptance is small. The value which varies the most with respect to variations in the susceptance is the measured value of the electron density; however, in order to measure the actual electron density with an accuracy of within 10% so as to, for example, stably produce high function thin films with good reproducibility, it is necessary to set the absolute value of the susceptance to a level of approximately 0.2 mS or less.

FIG. 14 shows how the measured values of the plasma density vary with respect to the resistance value of the probe. The probe which was used for the measurement had a variable resistance, and it was possible to ignore the reactance component thereof. The conditions of the plasma measured were identical to those in FIG. 13. It can be seen from FIG. 14 that in order to measure the actual plasma density to within an accuracy of 10% or less, the resistance value of the probe must be 5 k$\Omega$ or more. This is in agreement with the case shown in FIG. 13 in that the absolute value of the impedance of the probe must be 5 k$\Omega$ or more. That is to say, a susceptance of 0.2 mS corresponds to an impedance of 5 k$\Omega$. Furthermore, when both the resistance component and the reactance component were made variable, it was confirmed that if the absolute value of the impedance of the probe was 5 k$\Omega$ or more, essentially correct measurement was possible.

The capacitance of the sheath between the probe electrode and the plasma varies with the voltage applied to the sheath, the plasma density, the shape of the probe electrode, and the like. In the cases shown in FIGS. 13 and 14, the capacitance of the sheath when the probe was made floating in a direct current manner was 1.55 pF. In FIGS. 13 and 14, 100 MHz was employed as the excitation frequency of the plasma; at this frequency, 1.55 pF resulted in 1.03 k$\Omega$. Accordingly, in order to conduct an accurate measurement within 10% it is necessary to set the absolute value of the impedance of the probe itself to 5 k$\Omega$ or more, and in consideration of this, the impedance of the probe itself should be at least 5 times the impedance of the sheath capacitance in the case in which the probe is made floating in a direct current manner.

On the other hand, in a conventional single probe, as shown in, for example, FIG. 15, an electrode portion 1501 is connected to a DC power source and an ammeter via a core, the core is shielded with a metal pipe 1503, and the metal pipe is grounded. Accordingly, the capacitance between the probe electrode and the grounding point is normally 100 pF or more, and thus the impedance is capacitive and small. It was determined with respect to such probes that in order to conduct the accurate measurement to within 10% which was described above, the maximum allowable capacitance was roughly 0.3 pF, and thus the accurate measurement of plasma was completely impossible with probes of a conventional structure. For the same reasons, standard double probes, emission probes, and the like were also unsuitable for the measurement of high frequency discharge plasma.

With respect to double probes, a structure was considered for the measurement of high frequency excitation plasma in which a low pass filter was employed so that the two probes were made floating with respect to the ground at the excitation frequency of the plasma; however, in order to reduce the parasitic capacitance between the probe and the ground, it is necessary to isolate the probe and the chamber walls, and the appropriate chamber structures are limited. Furthermore, the production of that portion of the probe which extends outside of the chamber is extremely difficult. Additionally, the impedance of the low pass filter used in the double probe at the excitation frequency must be extremely large; for example, at least 100 k$\Omega$ when the excitation frequency is 10 MHz, and the actual production thereof presents difficulties. Furthermore, among all plasma parameters, only the electron energy distribution of electrons having a comparatively high kinetic energy can be measured using the double probe, and the measurement of the plasma potential and density, which is most necessary in practice, can not be undertaken.

As described above, the instrument for measuring plasma excited by a high frequency in accordance with the present invention comprises a wire for electrically connecting a first electrode disposed within a plasma and a terminal provided outside a vacuum chamber which serves to take out signals, and a first insulator which is provided so as to cover at least a portion of the surface of the wire; the absolute value of the impedance at a given frequency between the first electrode and the ground when looking into the terminal side from the first electrode is 5 times or more the absolute value of the impedance at this given frequency between the first electrode and the plasma in a state in which no direct current flows through the first electrode. Accordingly, the potential of the probe electrode disposed in the high frequency discharge plasma fluctuates in such a manner as to accurately follow the fluctuations over time of the potential in the high frequency discharge plasma space, so that the difference between the potential of the probe electrode disposed in the high frequency discharge plasma and the plasma potential does not vary even at high frequencies, and it is possible to measure all parameters accurately and simply by using a measurement method identical to that of conventional single probes. Furthermore, it is of course the case that the measurement of direct current discharge plasma can be conducted using such a measuring instrument.

(Description of the References)

101 electrode, 102 insulating tube, 103 electrode, 104 capacitor, 105 insulating tube, 106 coaxial cable, 107 insulating tube, 108 capacitor, 109 insulator, 110 wire, 111 filter, 201 electrode, 202 electrode, 203 filter, 204 wire, 401 electrode, 402 insulating tube, 403 electrode, 404 insulating film, 405 insulating tube, 406 coaxial cable, 501 electrode, 502 insulating tube, 503 insulating tube, 504 coaxial cable, 601, 602 coaxial cables, 603, 604 capacitors, 605 insulating tube, 606 insulating tube, 607, 608 filters, 701 coaxial cable, 702 insulating tube, 703 connector, 704 current input terminal, 705 connector, 706 variable impedance circuit, 1101 electrode, 1102 resistor, 1103 coaxial cable, 1104 insulating tube, 1105 insulating tube, 1106 connector, 1107 current input terminal, 1108 coaxial cable, 1109 high frequency voltage measurement apparatus, 1501 electrode, 1502 insulator, 1503 metal pipe.

BEST MODE FOR CARRYING OUT THE INVENTION

Hereinbelow, the present invention will be explained in greater detail using Embodiments; however, it is of course the case that the present invention is in no way limited to these Embodiments.

(Embodiment 1)

Figure 1:
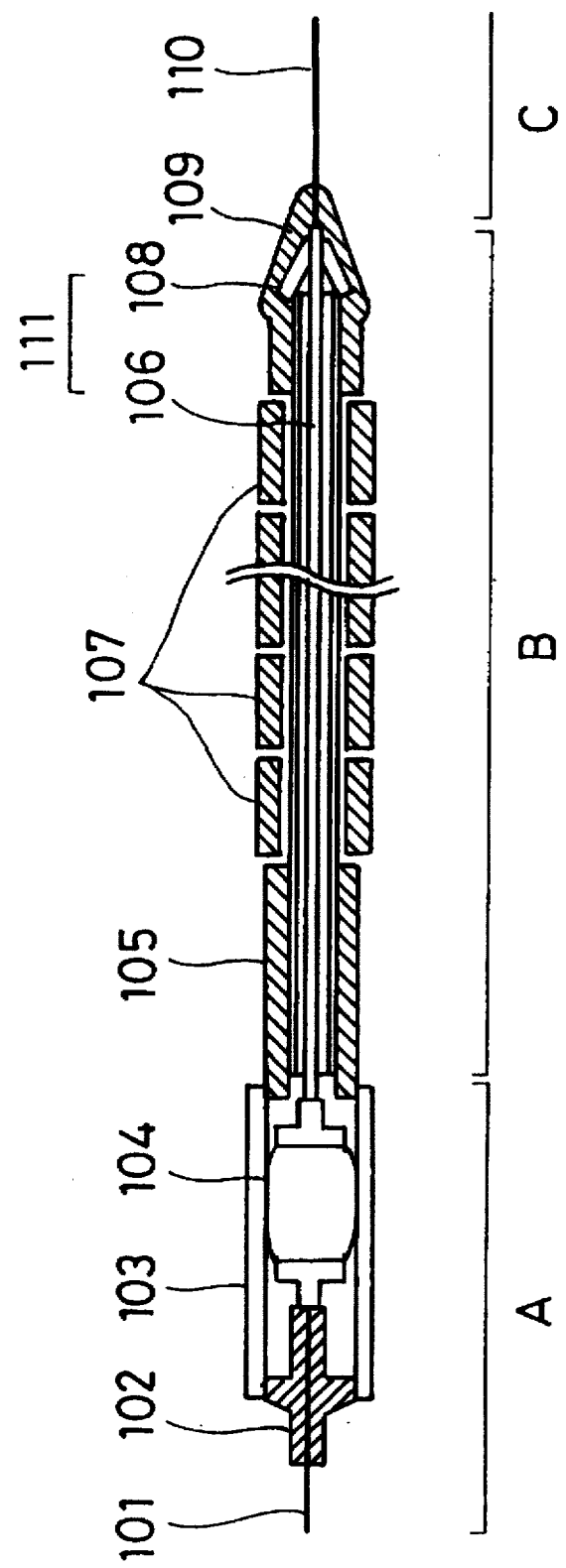
FIG. 1 is a schematic cross sectional view showing Embodiment 1.

FIG. 1 shows a cross sectional view of a portion of an instrument for measuring plasma which shows a first Embodiment of the present invention.

Reference 101 indicates a probe electrode which is disposed within the plasma; this is, for example, a tungsten wire having a diameter of 0.1 mm$\phi$. Reference 103 indicates a metal electrode which is also disposed in the plasma; this is, for example, an aluminum or stainless steel pipe having an outer diameter of 3.4 mm$\phi$ and inner diameter of 2.5 mm$\phi$. This is connected with electrode 101 via capacitor 104, and is made floating in a direct current manner. Capacitor 104 is a through-type capacitor of, for example, from 1,000 pF to 10,000 pF. The through-type capacitor core electrode and electrode 101 are connected, for example, by means of spot welding. If the capacity of the through-type capacitor is represented by $C_p$, then the impedance of electrode 103 and the core electrode is given by $1/\omega C_p$.

Insulating tube 102 is a ceramic tube having, for example, an outer diameter of 1.4 mm and an inner diameter of 0.4 mm; it is affixed to electrode 103 and capacitor 104 by means of, for example, an inorganic adhesive. If a comparatively narrow and long gap is provided between insulating tube 102 and electrode 101, the conductive material coming from the plasma can not penetrate to the rear, so that it is possible to prevent the short circuiting of electrode 101 and electrode 103 by means of attaching the conductive material.

Reference 106 indicates a coaxial cable; this is a semi-rigid coaxial cable having, for example, an outer diameter of the outer conductor of 2.19 mm. One end of the core of the coaxial cable 106 is connected to the core electrode of capacitor 104. The other end thereof is connected with the outer conductor of coaxial cable 106 via capacitor 108, and is further connected to wire 110. The length of coaxial cable 106 is approximately equivalent to ¼ the wavelength within coaxial cable 106 at the excitation frequency of the plasma. The length may also be an odd multiple thereof. In the case in which, for example, the excitation frequency is 200 MHz, and the wavelength shortening coefficient of the coaxial cable is 0.7, the length of coaxial cable 106 is 26.25 cm. Since this length is in proportion to the wavelength, it is possible that the cable will not extend into the chamber if the excitation frequency is low; however, in such cases, it presents absolutely no problem if the portion of the coaxial cable to the right of the break in FIG. 1, or the entirety of the coaxial cable, is disposed outside the chamber.

Capacitors 108 comprise, for example, 2000 pF chip capacitors; 4 of these are connected in parallel between the outer conductor of coaxial cable 106 and the core so as to form a total capacitance of 8000 pF. It is of course the case that the number of capacitors 108 need not be 4. The absolute value of the impedance at 200 MHz with 8000 pF is approximately 0.1 $\Omega$; by means of these capacitors, the core and the outer conductor are essentially short circuited at high frequencies.

When this coaxial cable, which has a length equal to an odd multiple of ¼ of the wavelength, and one end of which is terminated with an impedance load which is sufficiently smaller than a characteristic impedance, is looked into from the other end, the impedance appears essentially infinitely large. That is to say, it functions as a filter having a large impedance at odd multiples of the excitation frequency. Reference 111 indicates a filter comprising the coaxial cable 106 and the capacitors 108. Furthermore, the present probe possesses an advantage which was not present in conventional probes, in that since a coaxial cable is employed in this portion, the probe can be freely bent within the chamber.

Reference 110 indicates a wire; this is, for example, an aluminum wire having a diameter of 0.5 mm$\phi$, the surface of which is coated with alumina ceramics. Although not depicted in FIG. 1, one end of wire 110 is connected, for example, to a current input terminal, and the current which flows from the plasma into the electrode is conducted to the exterior of the chamber. Additionally, this is electrically connected to a constant voltage source via, for example, a low pass filter and a direct current ammeter. Of course, reference 110 need not necessarily represent a wire; no problem is presented insofar as this reference represents a substance which can conduct current. Additionally, a low pass filter, an ammeter, a constant voltage source, and the like may be directly connected to the core of coaxial cable 106, so that wire 110 need not be present. Insulating tube 105 is a ceramic tube having, for example, an outer diameter of 3.8 mm and an inner diameter of 2.2 mm; it is affixed to the coaxial cable 106 and electrode 103 using, for example, an inorganic adhesive. This is provided in order to isolate the plasma, and to insulate the outer conductor of coaxial cable 106 from electrode 103. Insulating tubes 107 comprise, for example, ceramic tubes and are provided in order to electrically isolate the plasma from the outer conductor of coaxial cable 106. In this example, a number of insulating tubes having an inner diameter which is somewhat larger than the outer diameter of coaxial cable 106 are employed so that coaxial cable 106 is capable of bending. Insulator 109 comprises, for example, an inorganic filler, and is provided in order to electrically isolate the plasma. It is of course the case that insulating tubes 107 and insulator 109 need not be provided if no plasma is present in the vicinity thereof. Furthermore, insulating tubes 107 need not be provided even if plasma is present in the vicinity thereof so long as contact between the coaxial cable 106 and plasma does not present a problem. 107 and 109 may be coated with ceramics. At this time, since the coaxial cable can be comparatively freely bent, it is not necessary to provide notches therein.

Figure 2:
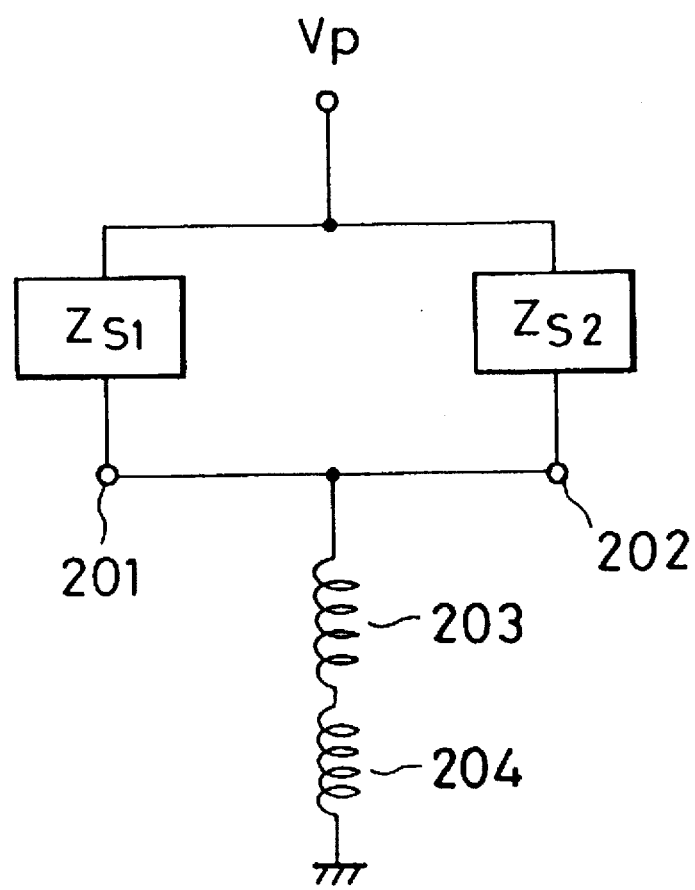
FIG. 2 is a circuit diagram showing a high frequency equivalent circuit of Embodiment 1.

FIG. 2 shows a high frequency equivalent circuit of the instrument for plasma measurement in accordance with Embodiment 1. References 201, 202, 203, and 204 correspond to electrode 101, electrode 103, filter 111, and wire 110, respectively. Reference $V_p$ indicates a plasma space potential, and $Z_{s1}$, and $Z_{s2}$ are impedances of sheaths executed around electrodes 101 and 103. In actuality, a capacitor 104 is present between electrode 101 and electrode 103; however, in comparison with $Z_{s2}$, the impedance thereof is sufficiently small, so that it was ignored. Accordingly, 201 and 202 have the same potential at high frequencies. One end of wire 110 is connected to a low pass filter which is terminated by a capacitor, and is thus grounded at high frequencies.

In order to accurately measure all parameters of the high frequency discharge plasma, it is necessary that the plasma space potential and the potential of the probe electrode oscillate in a parallel manner, and thus it is necessary that the absolute value of the probe impedance be sufficiently larger than the absolute value of the sheath impedance.

In the present probe, an electrode 103, which has a comparatively large surface area in contact with the plasma, is provided in addition to electrode 101, so that the sheath impedance is sufficiently smaller than that in conventional probes. The sheath impedance $Z_s$ is expressed by the following formula:

$$Z_s = Z_{s1} \times Z_{s2}/(Z_{s1}+Z_{s2}) \quad (1)$$

Here, for example, $Z_{s2}$ is 0.16 times $Z_{s1}$, and $Z_s$ is 0.14 times $Z_{s1}$. In contrast, in conventional probes, there is a only an electrode corresponding to 101, so that the impedance of the sheath is on the level of $Z_{s1}$. The difference between these two is clear.

A simple increase in the surface area of electrode 101 could be considered in order to reduce the sheath impedance; however, if this is done, a large direct current flows into electrode 101, so that the measurement itself disturbs the plasma. In the present probe, electrode 103 is connected to electrode 101 via a capacitor, and a direct current does not flow in electrode 103. The direct current flows only through the electrode 101, which has a small surface area, so that there is almost no disruption of the plasma.

The present probe is characteristic not merely in that the sheath impedance is small, but also in that the impedance of the probe at the excitation frequency is large, as a result of the provision of filter 111. For example, the absolute value of the impedance of filter 111 at an excitation frequency of 200 MHz is 6.2 kΩ. The reactance of wire 110 is 160 Ω, and the absolute value of the impedance of electrode 101 with respect to the ground is reliably more than 6 kΩ. In contrast, in conventional probes, this level was less than 200 Ω.

As a result of these two characteristics, the absolute value of, for example, the impedance of the present probe is as much as 105 times the absolute value of the impedance of the sheath, and highly accurate measurement of all parameters can be conducted. Next, an example thereof will be discussed.

Figure 3:
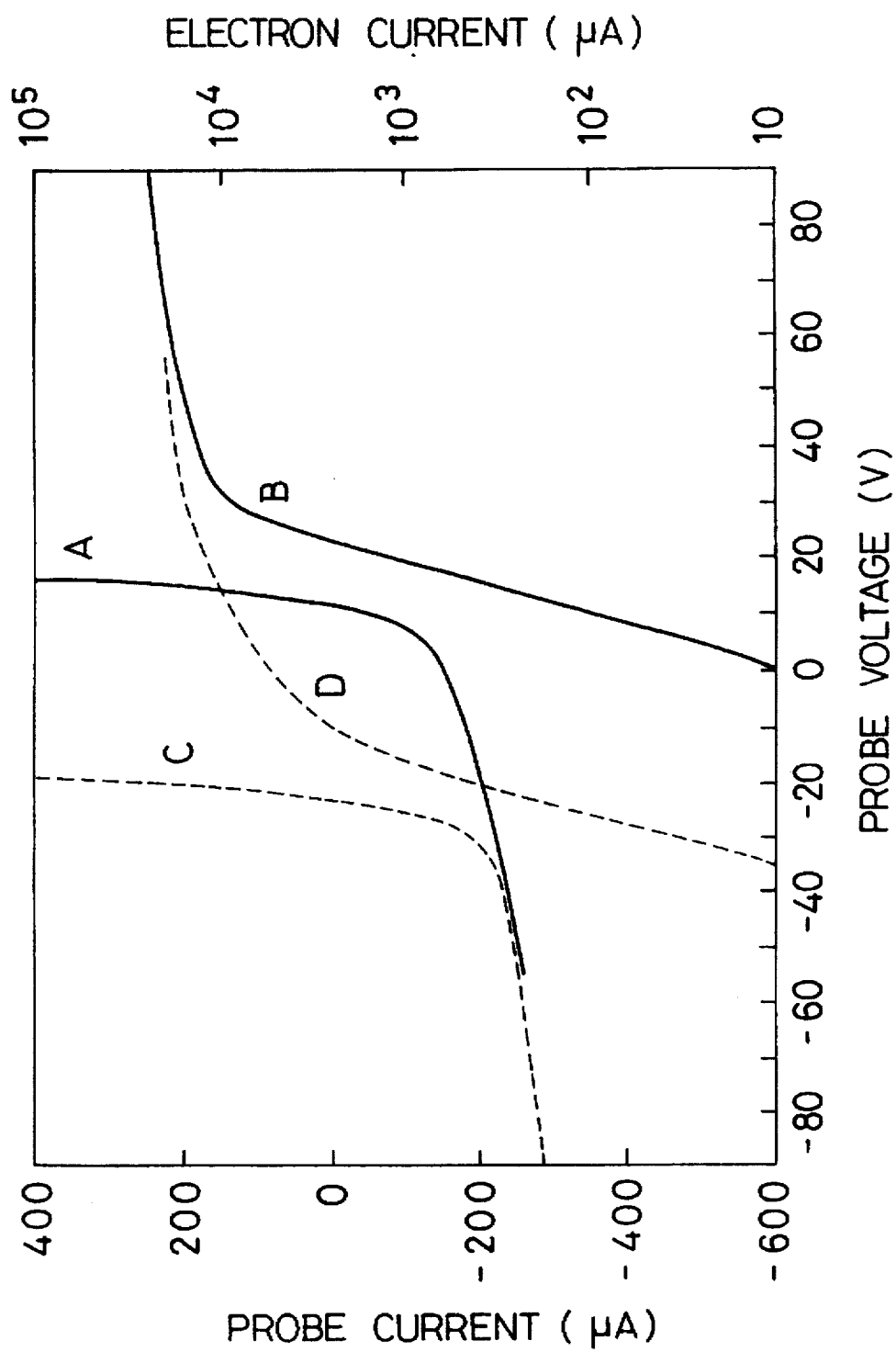
FIG. 3 is a graph showing the current voltage characteristics of Embodiment 1 and a conventional example.

FIG. 3 shows the current/voltage characteristics of the direct current of the probe. The horizontal axis indicates the voltage applied to the probe from the exterior, the left hand vertical axis indicates the current value of the probe, and the right hand axis indicates the electron current value; solid lines A and B and dotted lines C and D indicate, respectively, measured values of the probe of the present embodiment and a conventional single probe, and A and C indicate the probe current, while B and D indicate the electron current. The plasma conditions in both cases were completely identical; however, the results obtained in the case of the conventional single probe showed a voltage which was shifted by as much as 30 V lower, so that it can be seen that the range in which the voltage of the electron current increases and the range of the portion which is in agreement with the straight line prior to saturation are narrow. It was learned that the more the plasma potential and the potential of the probe electrode oscillate in a parallel manner, the greater the increase in the voltage of the current/voltage characteristics, and the more possible an accurate measurement of all plasma parameters. Furthermore, the plasma potential of the same plasma as determined by means of an analysis of ion energy, which is a completely separate measurement method, was 24 V, and this was in agreement with the results of the measurement by means of a probe of the present embodiment. From these facts, it was proved that the measurement of plasma excited by a high frequency, which was completely inaccurate when a conventional probe was used, could be accurately carried out by using the present probe.

Next, a modified example of the portion marked B in FIG. 1 will be explained. The outer conductor of the coaxial cable 106 of FIG. 1 is in a floating state; however, no problems will be caused even if it is grounded. In such cases, the end of coaxial cable 106 on the side of wire 110 is grounded, and it is no longer necessary to take the impedance of wire 110 into consideration.

In addition, it is permissible not to provide capacitor 108, and to short circuit the core and outer conductor of coaxial cable 106 at the side at which capacitor 108 was applied. In this way, use is possible at still higher frequencies, and the structure is also simplified. However, in this case, it is necessary to place the outer conductor in a floating state in a direct current manner. Accordingly, in the case in which the outer conductor is grounded, it is necessary to conduct this grounding via a capacitor, and furthermore, it is necessary to completely isolate the plasma so that no current flows from the plasma into the outer conductor.

Figure 4:
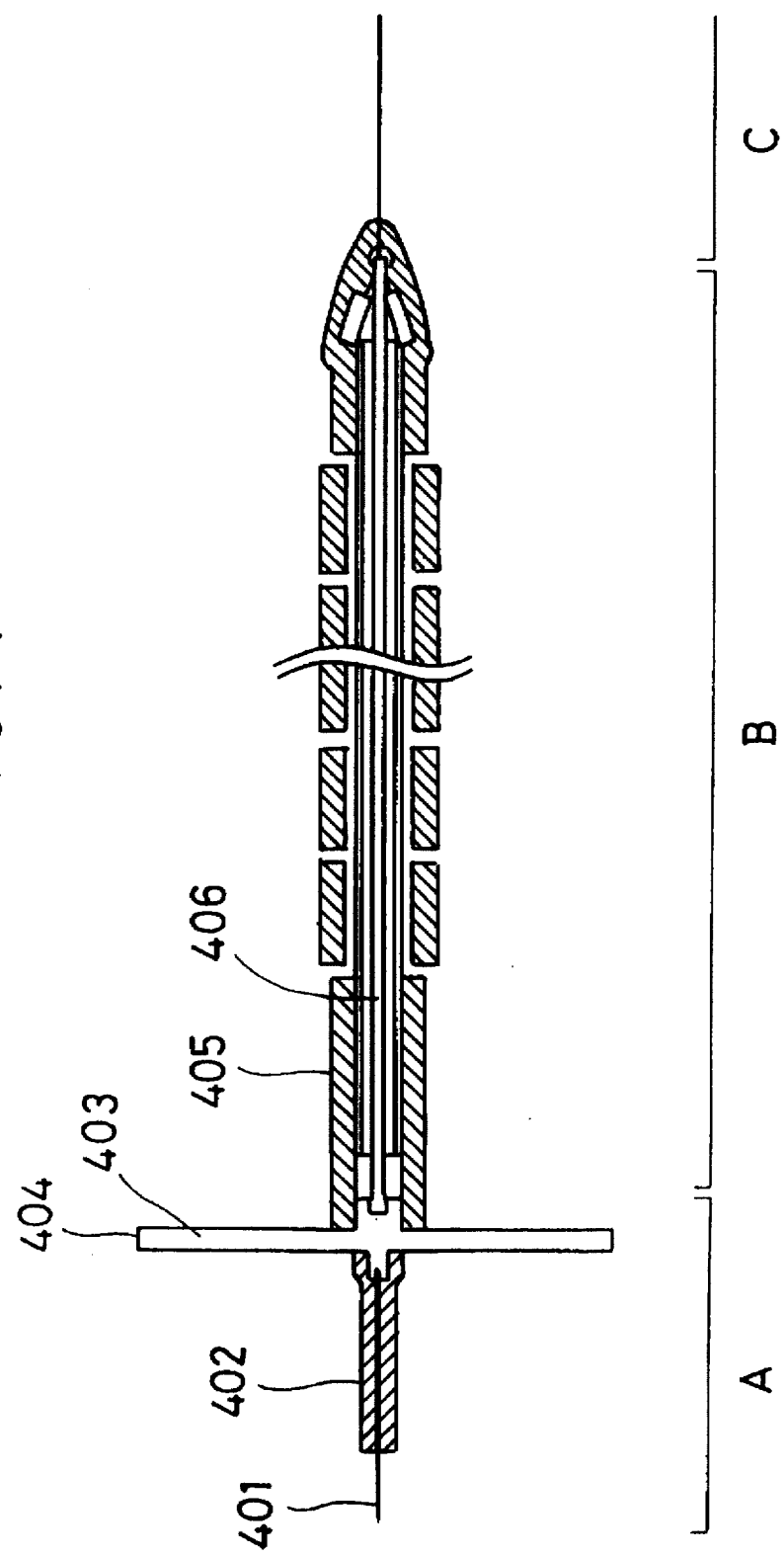
FIG. 4 is a schematic cross sectional view showing a modified example of Embodiment 1.

Next, a modified example of the portion marked A in FIG. 1 is shown in FIG. 4. Reference 401 indicates an electrode which is disposed in a plasma and which corresponds to an electrode 101; this comprises, for example, a tungsten wire having a diameter of 0.1 mm. Reference 403 indicates an electrode which is disposed in the plasma, and comprises, for example, a circular copper plate having a diameter of 22 mm and a thickness of 0.84 mm. The portions of this plate which come into contact with the plasma are covered with an insulating film 404. Insulating film 404 comprises, for example, alumina ceramics, and the thickness thereof is, for example, approximately 120 nm. 403 is continuous with 401. References 402, 405, and 406 are identical to, respectively, insulating tube 102, insulating tube 105, and coaxial cable 106. Electrode 401 and electrode 403 are connected, for example, by means of spot welding, and the core of coaxial cable 406 and electrode 403 are connected by means of, for example, soldering.

Electrode 403 is continuous with electrode 401; however, because this electrode is covered by insulating film 404, no direct current flows between it and the plasma. However, it is possible for the insulating film 404 to function as a capacitor, and for a high frequency current to flow. Accordingly, by means of providing electrode 403, it is possible to reduce the impedance of the sheath formed around the electrode at high frequencies. That is to say, electrode 403 has the same function as electrode 103 in FIG. 1, and the high frequency equivalent circuit is completely identical to that in FIG. 2. The characteristic features of the probe shown in FIG. 4 are that, since no capacitor is used between electrode 401 and electrode 403, the structure is simplified, and use at higher frequencies is possible.

Figure 5:
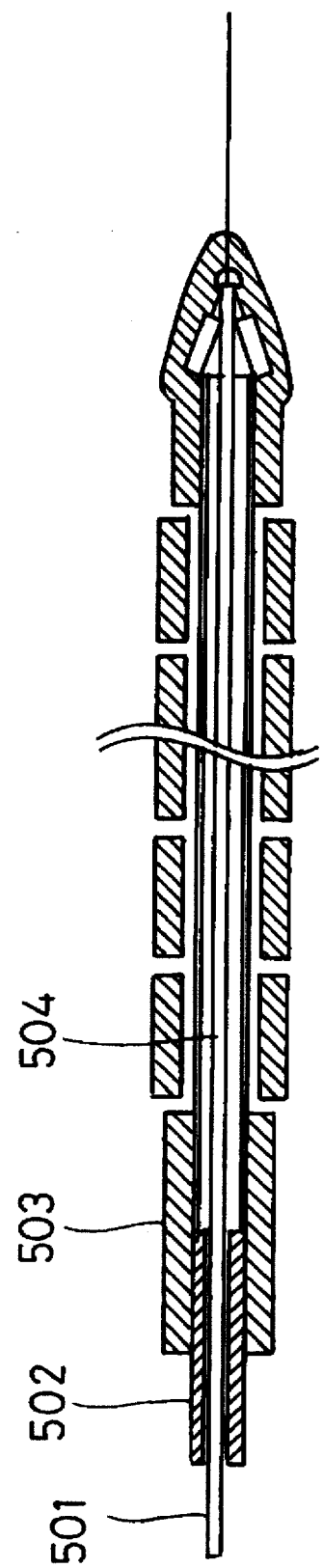
FIG. 5 is a schematic cross sectional view showing another modified example of Embodiment 1.

Next, a second modified example of the portion marked A in FIG. 1 is shown in FIG. 5. Portions identical to those in FIG. 1 are omitted. References 502, 503, and 504 correspond to, respectively, insulating tube 102, insulating tube 105, and coaxial cable 106. Insulating tube 502 and insulating tube 503, as well as insulating tube 503 and coaxial cable 504, are affixed by means of an inorganic adhesive. Reference 501 indicates an electrode which is disposed in a plasma; this comprises, for example, the core of coaxial cable 504. Of course, other conductive materials may be connected to the core and used as the electrode.

In the probe shown in FIG. 5, an electrode corresponding to electrode 103 in FIG. 1 is not present, and the impedance of the sheath is approximately the same as that in the conventional probe. However, if the absolute value of the impedance of the electrode is 5 times or more the absolute value of the impedance of the sheath, accurate measurement is possible. In the present embodiment, the absolute value of the impedance of the electrode at an excitation frequency of 200 MHz is approximately 15 times the absolute value of the impedance of the sheath. However, the margin is smaller in comparison with that in FIG. 1, and this probe is vulnerable to changes in the characteristics of the filter resulting from fluctuations in the excitation frequency, changes in temperature, or the like. Because the structure is extremely simple, production is facilitated.

(Embodiment 2)

Figure 6:
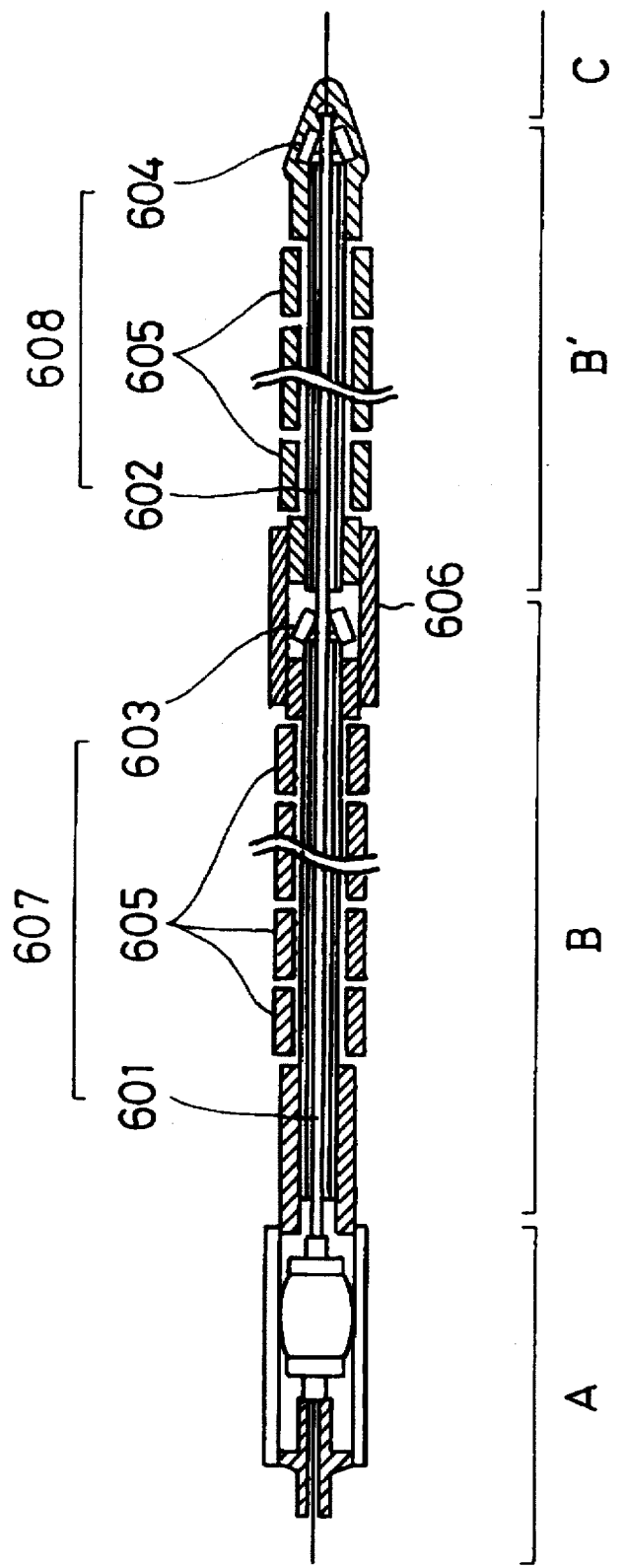
FIG. 6 is a schematic cross sectional view showing Embodiment 2.

Next, a modified example of Embodiment 1 is shown in FIG. 6. In this embodiment, a new portion labeled B' is provided between the portions marked B and C. References 601 and 602 indicate coaxial cables; these comprise, for example, semi-rigid coaxial cables having a diameter of 2.19 mm. The length of the external conductors of cables 601 and 602 is equivalent to, respectively, ¼ and ⅛ the wavelength in the coaxial cable at the excitation frequency. The length of these cables may also be an odd multiple thereof. References 603 and 604 indicate capacitors which correspond to reference 108; these comprise, for example, chip capacitors having superior high frequency characteristics. Reference 605 corresponds to insulating tube 107. Reference 606 comprises an insulating tube; this is, for example, a ceramic tube having an inner diameter of 4 mm and an outer diameter of 5 mm. This is provided in order to isolate the plasma and to connect coaxial cables 601 and 602. Reference 607 functions as a filter comprising coaxial cable 601 and capacitor 603; reference 608 functions as a filter comprising coaxial cable 602 and capacitor 604. The difference between filters 607 and 608 is that the frequency at which they function as filters differs. As explained above, filter 607 has a large impedance at the excitation frequency and at frequencies which are odd multiples thereof. In contrast, filter 608 has a large impedance at odd multiples of 2 times the excitation frequency; that is to say, at frequencies which are even multiples of the excitation frequency. Since the space potential of the plasma generally does not oscillate in a sine wave pattern, higher harmonic components are included therein. Therefore, in order to bring the probe electrode into completely parallel oscillation with the plasma potential, it is necessary to increase the impedance of the probe electrode not merely with respect to the excitation frequency, but also with respect to the higher harmonic components. By connecting filters 607 and 608 in series as shown in FIG. 6, it is possible to provide a large impedance with respect to all higher harmonic frequency components. When higher harmonic components are present in the oscillation of the plasma potential, the probe shown in FIG. 6 is capable of more accurate measurement than the probe of Embodiment 1.

Next, a modified example of the present embodiment will be discussed. In FIG. 6, a reversal of the order in which filters 607 and 608 are disposed will cause no problem. Furthermore, a plurality of filters 607 or 608 may be connected in series in order to increase the size of the impedance. There is of course no restriction in the order of disposition.

Furthermore, a plurality of filters in which the length of the outer conductor of the coaxial cable is equal to an odd multiple of ¼ the wavelength in the coaxial cable at each excitation frequency, or an odd multiple of ⅛ the wavelength, may be connected in series in order to measure a plasma in which, for example, a plurality of excitation frequencies exists.

Additionally, insulating tube 606 may be replaced by some other part, so long as that part is capable of isolating the plasma. It is of course the case that if plasma is not present at this portion it is not necessary to provide such a part. Furthermore, in FIG. 6, coaxial cables 601 and 602 are shown disposed in a straight line; however, it is of course the case that these coaxial cables may be bent, and the connecting portion may be set to a freely selected angle. It is also possible to provide other wiring between the cores of the coaxial cables 601 and 602 at the portion at which they are connected.

Aside from the part labeled A in FIG. 6, the portion to the right of any freely selected spot in the probe may disposed outside the chamber. Furthermore, the modified examples described under Embodiment 1 may also be employed in the present embodiment.

(Embodiment 3)

Figure 7:
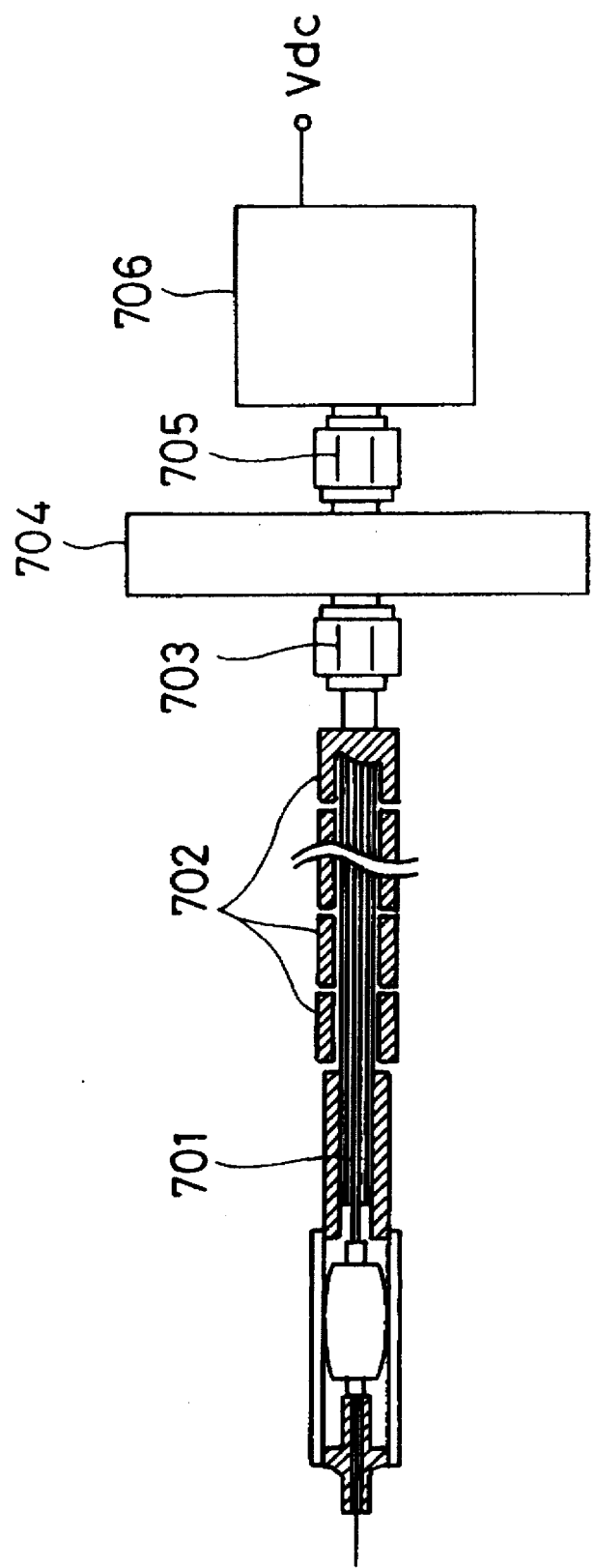
FIG. 7 is a schematic cross sectional view showing Embodiment 3.

In FIG. 7, a probe is shown in which the portions labeled B and C are modified. Coaxial cable 701 is, for example, a semi-rigid coaxial cable in which the diameter of the outer conductor is 2.19 mm, and the length of the outer conductor is 192 mm. A connector 703 is connected to the right end of coaxial cable 701. Reference 702 corresponds to insulating tube 107. Current input terminal 704 has connectors attached to both ends thereof and is affixed to the chamber wall. Reference 706 indicates circuitry which enables the impedance on the side of 706 when looking from connector 705 to be varied over a wide range.

Figure 8:
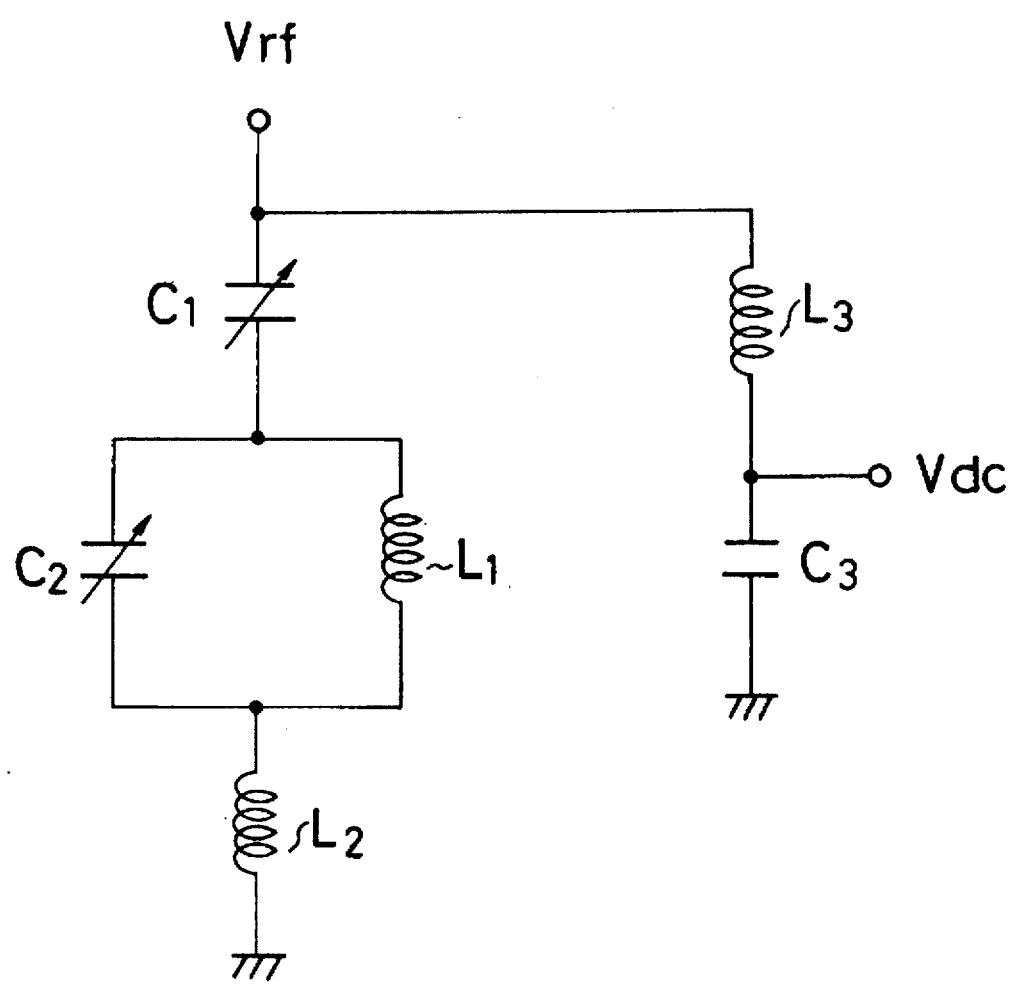
FIG. 8 is a circuit diagram showing an impedance equivalent circuit of Embodiment 3.

The inner circuitry of reference 706 is shown in FIG. 8. In FIG. 8, $V_{rf}$ and $V_{dc}$ indicate, respectively, the potential of the core of capacitor 705 and the current potential applied to the probe electrode. References $C_1$ and $C_2$ indicate variable capacitors having a maximum capacity of, respectively, 40 pF and 50 pF, while references $L_1$ and $L_2$ indicate inductors of, respectively, 42 nH and 24 nH. References $C_3$ and $L_3$ indicate, respectively, a capacitor of 2000 pF and an inductor of 1.4 μH; these form a low pass filter. The impedance between $V_{rf}$ and the ground can be varied by varying the capacitance of $C_2$ or $C_1$. For example, when $C_1$ is fixed at 24 pF and $C_2$ is made variable, the impedance at 100 MHz can be set in a continuous manner within a range of from −15.5 Ω to 60.5 Ω. Various circuit structures are possible depending on the target impedance range. What is shown in FIG. 8 is only one example, and it is of course the case that other circuits are possible.

Next, the superior features of a probe into which the impedance variable circuit shown by reference 706 is built will be discussed.

Figure 9:
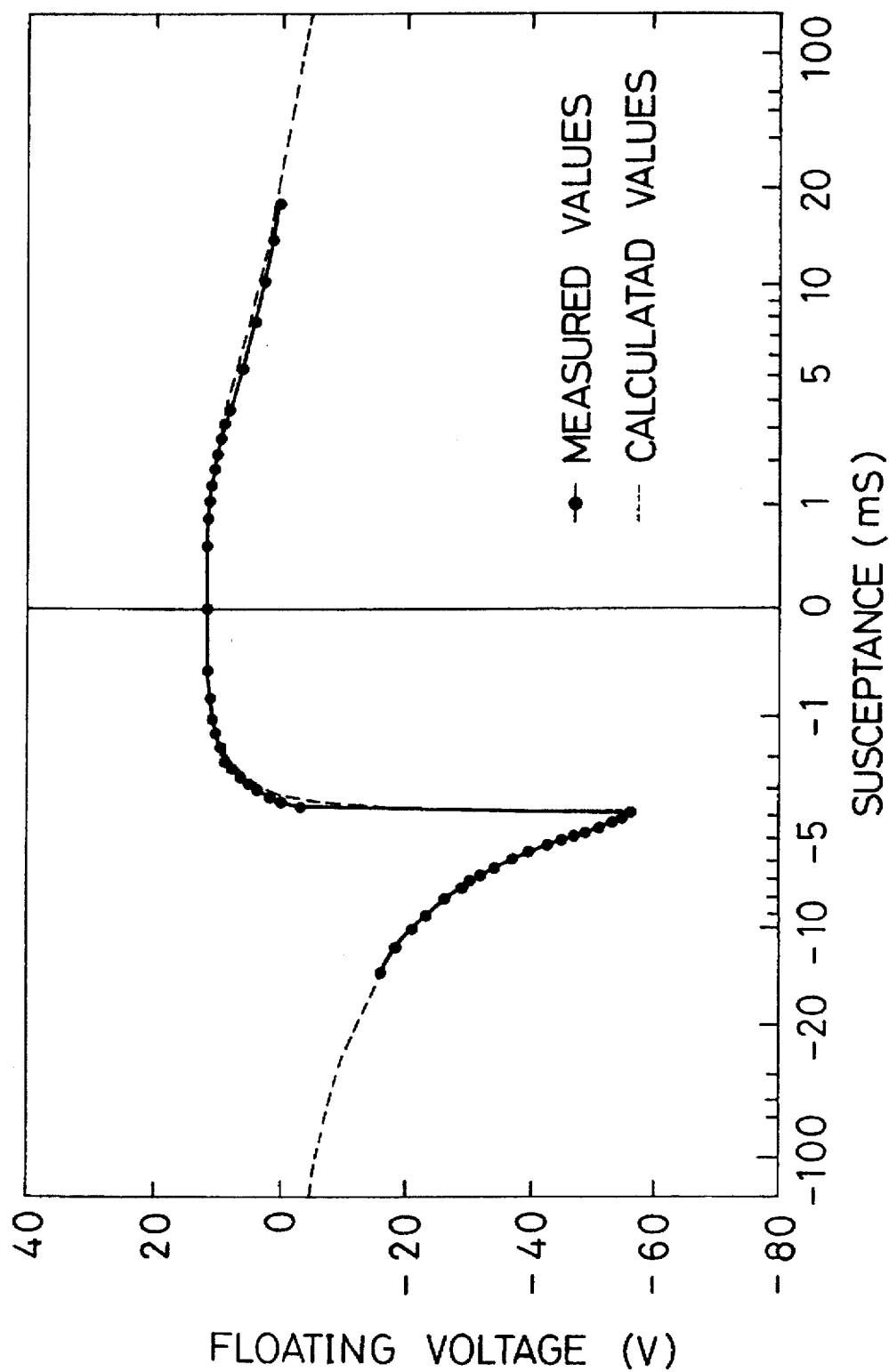
FIG. 9 is a graph showing the relationship between the floating potential and the susceptance in Embodiment 3.
Figure 10:
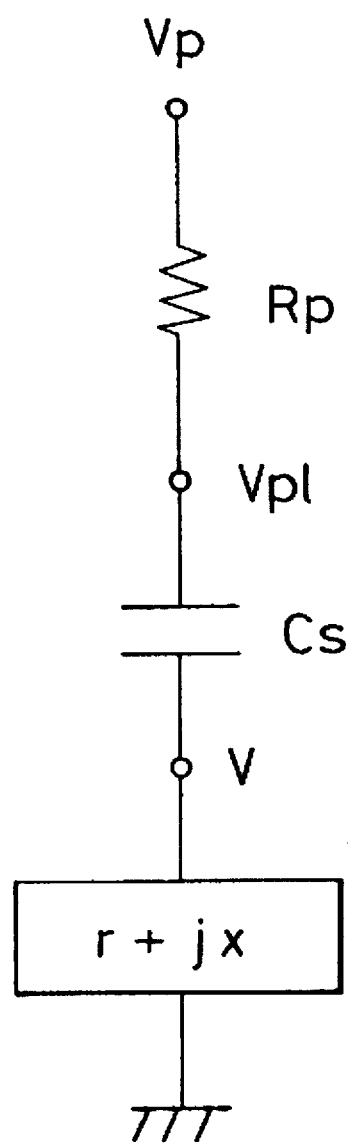
FIG. 10 is a circuit diagram showing a high frequency equivalent circuit of Embodiment 3.

FIG. 9 shows an example of the relationship between the potential of the probe electrode and the susceptance between the probe electrode and the ground, when the probe is made floating in a direct current manner. In this case, there is little probe power loss at the excitation frequency, so that this loss may be ignored. In FIG. 9, the black circles and the solid line indicate the actually measured values, while the dotted line indicates the calculated values. The calculated values were obtained using the high frequency equivalent circuit shown in FIG. 10. References $v_p$ and $v$ indicate, respectively, the plasma potential and the probe electrode potential. Resistance $R_P$ and capacitance $C_S$ are inserted in series between the plasma and the probe electrode, an $v_{p1}$ indicates the potential of the portion connected to the plasma via $R_p$. The impedance is given by r+jx. References $v_p$, $v_{p1}$, and $v$ are expressed by the following formulas.

$$v_p = V_p \exp(j(wt+\phi)) + \bar{v}_p$$

$$v_{p1} = V_{p1} \exp(jwt) + \bar{v}_{p1} \quad (1)$$

$$v = V \exp(j(wt+\Psi)) + \bar{v}$$

Here, $V_p$, $V_{p1}$, and $V$ represent the amplitude of, respectively, $v_p$, $v_{p1}$, and v, and $\bar{v}_p$, $\bar{v}_{p1}$, and vrepresent the average values, respectively, of $v_p$, $v_{p1}$, and v. References $\phi$ and $\Psi$ indicate the phase differences between, respectively, $v_p$ and $v_{p1}$, and $v_{p1}$ and v.

When $V_{p1}$ and $V$ are represented using $V_p$, then the following results:

$$V_{p1} = \left| \frac{1/jwC_s + r + jx}{R_p + 1/jwC_s + r + jx} \right| V_p \quad (2)$$

$$= \sqrt{\frac{r^2 + (x - 1/jwC_s)^2}{(R_p + r)^2 + (x - 1/jwC_s)^2}} V_p$$

$$V = \left| \frac{r + jx}{R_p + 1/jwC_s + r + jx} \right| V_p \quad (3)$$

$$= \sqrt{\frac{r^2 + x^2}{(R_p + r)^2 + (x - 1/jwC_s)^2}} V_p$$

Furthermore, $$\Psi = \tan^{-1}\left( \frac{r/wC_s}{r^2 + x(x - 1/wC_s)} \right) \quad (4)$$

By means of the voltage applied to the sheath, the thickness of the sheath changes, and the capacitance $C_s$ also changes in accordance with this. In the case of an ion sheath the thickness of the sheath is proportional to the voltage applied to the sheath raised to a power of n1, and in the case of an electron sheath, the thickness is proportional to the voltage raised to a power of n2. n1 and n2 are constants obtained by fitting from the actually measured values of FIG. 9. Using a constant d obtained from the floating voltage of the probe, the sheath capacitance at this time, and the current/voltage characteristics of the probe, $C_s$ is represented by the following formulas.

When $v < v_p^- 1$, $$C_s = C_{sf} \left( \frac{\bar{V}_{p1} - V_f}{v_{p1} - v} \right)^{n1} \quad (5)$$

When $v > v_p^- 1$, $$C_s = \frac{C_{sf}}{d} \left( \frac{\bar{v}_{p1} - V_f}{v - v_{p1}} \right)^{n2} \quad (6)$$

$R_p$ and $V_{p1}$ are obtained by fitting from the actually measured values of FIG. 9, and $\bar{v}_p$ and $v_p^- 1$ stand for the actually recorded values of the plasma potential when the susceptance is 0. If the value of v is established, then $v_{p1}$ and v can be obtained from Formulas (1) and (6).

A conduction current i such as that shown below, which depends on the values of $v_{p1}$ and v or $v_p^- 1$ and v, flows in the probe electrode.

The electron current $i_e$ follows the high frequency fluctuations, and is given by the following formulas.

When $v < v_{p1}$, $$i_e = \frac{en_e\bar{v}_e}{4} \exp\left( -\frac{e(v_{p1} - v)}{kT_e} \right) \quad (7)$$

When $v > v_{p1}$, $$i_e = \frac{en_e\bar{v}_e}{4} \exp(A(v - v_{p1})) \quad (8)$$

Here, A is a constant obtained from the current/voltage characteristics of the probe. The ion current $i_i$ does not follow the high frequency, but is rather in accordance with the average voltage.

When $v > v_p^- 1$, $$i_i = -\frac{en_i\bar{v}_i}{4} \exp\left( -\frac{e(\bar{v} - \bar{v}_p)}{kT_i} \right) \quad (9)$$

When $v < v_p^- 1$, $$i_i = -\frac{en_i\bar{v}_i}{4} (L\bar{v}_i + M) \quad (10)$$

Here, L and M represent constants which are determined from the current/voltage characteristics of the probe. The average value of the conduction current can be obtained by taking the time integral of $i_e + i_i$. In this way, the current/voltage characteristics of the probe in a high frequency discharge plasma can be calculated, and it is possible to obtain the floating voltage. By altering the impedance of the probe and conducting calculations, the characteristics shown by the dotted line in FIG. 9 can be obtained.

Incidentally, it can be seen in FIG. 9 that the actually measured values and the calculated values are in extremely close agreement. This means that the model discussed above is appropriate, and that the values of the fitting parameters n1 and n2 are accurate. That is to say, using the probe of the present example, by measuring the dependence on the susceptance of the current/voltage characteristics of the probe, it is possible to accurately obtain the values not merely of the plasma potential, density, and electron temperature, but also of those parameters particular to high frequency discharge plasma, such as the amplitude of the plasma potential, the sheath impedance, and the like.

It is possible to employ the probe of the present embodiment in such a manner that the size of the impedance of the probe electrode is increased as in Embodiment 1 and 2, in addition to the method of employment described above. Moreover, because a impedance variable circuit is provided, the probe can be adapted for use no matter how the excitation frequency changes. For example, in the present embodiment, by adjusting the variable capacitor in the impedance variable circuit, it is possible to maintain the absolute value of the impedance of the probe at all frequencies from 84 MHz to 158 MHz at a level of approximately 6 k$\Omega$ or more, so that accurate measurement is possible within this excitation frequency range. When a single impedance variable circuit is provided, the frequency range is restricted; however, if a plurality thereof are prepared, then it is in principle possible to cover all frequencies by simply adding impedance variable circuits in accordance with the frequency range. Furthermore, the excitation frequency and the impedance of the probe electrode at this frequency need not be known. As is clear from FIG. 9, when the susceptance is 0, that is to say, when the impedance is infinitely large, the probe voltage attains a maximum value, so that the impedance may be adjusted so that the floating voltage attains a maximum value.

Next, a modified example of the present embodiment will be discussed. In FIG. 7, it is sufficient if the coaxial cable 701 and the impedance variable circuit 706 are electrically connected; the portions 703–705 may have a structure other than that shown in FIG. 7. Furthermore, the modified examples explained under Embodiment 1 may be employed in the present embodiment as well.

(Embodiment 4)

Figure 11:
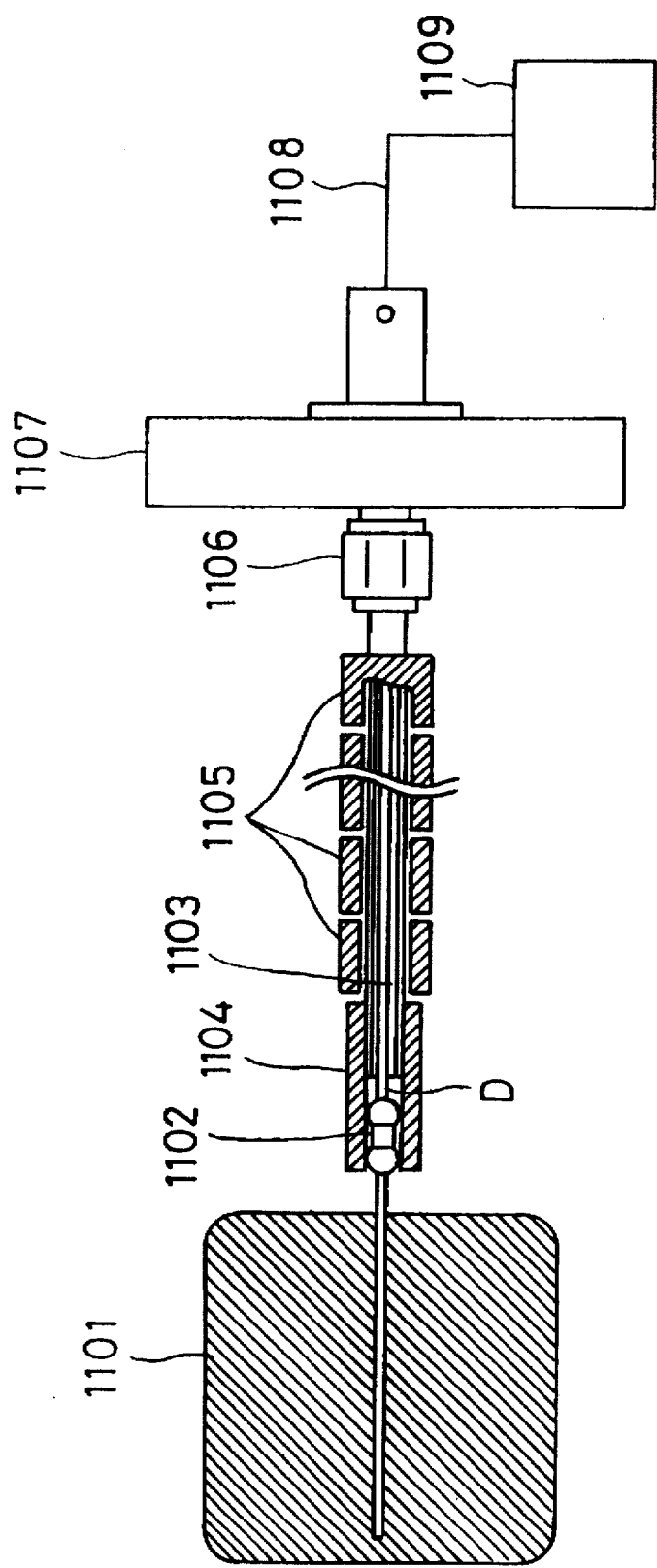
FIG. 11 is a schematic view showing Embodiment 4.
Figure 12:
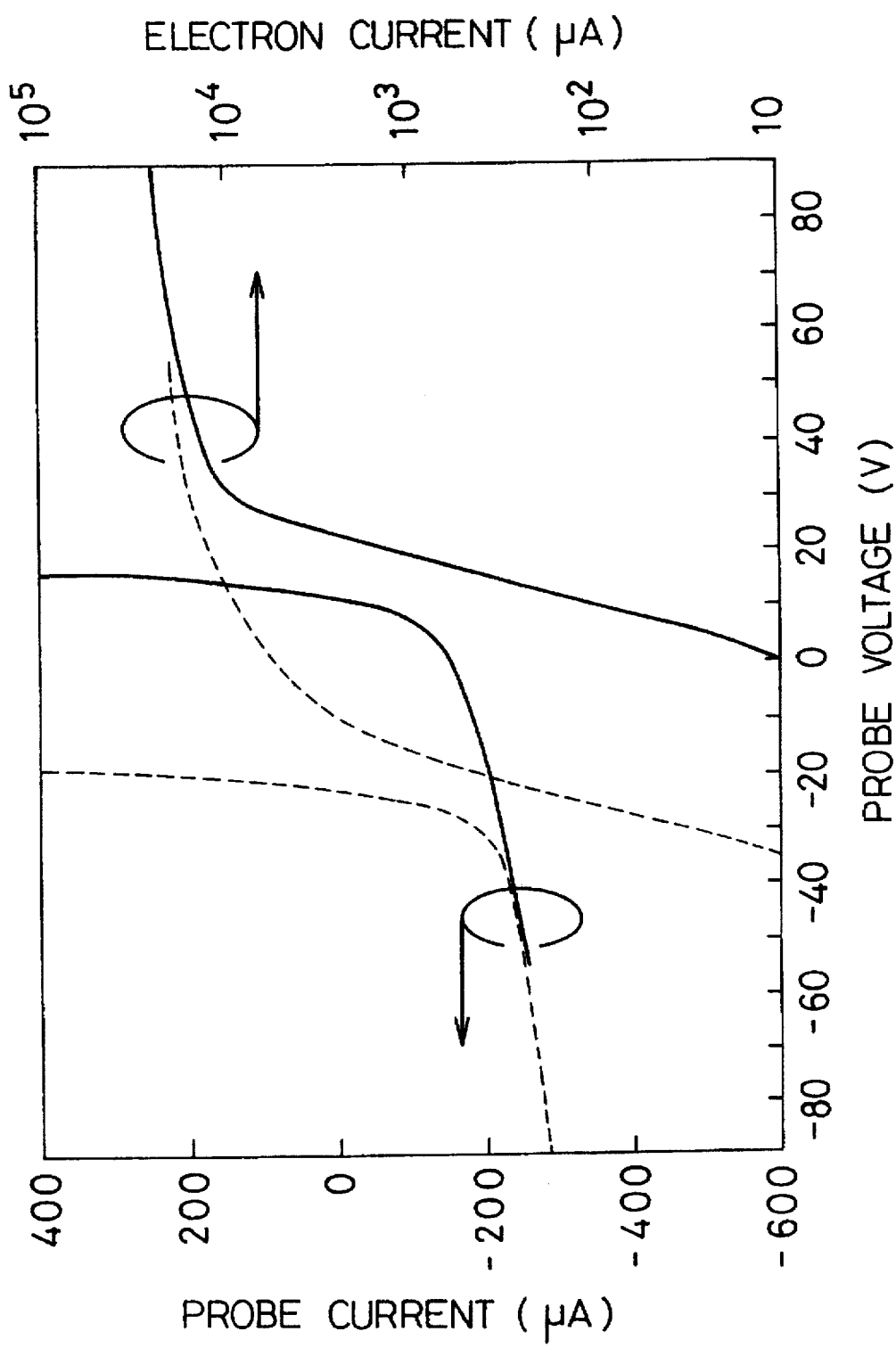
FIG. 12 is a graph showing the relationship between the probe current, the electron current, and the probe voltage in a conventional example.
Figure 13:
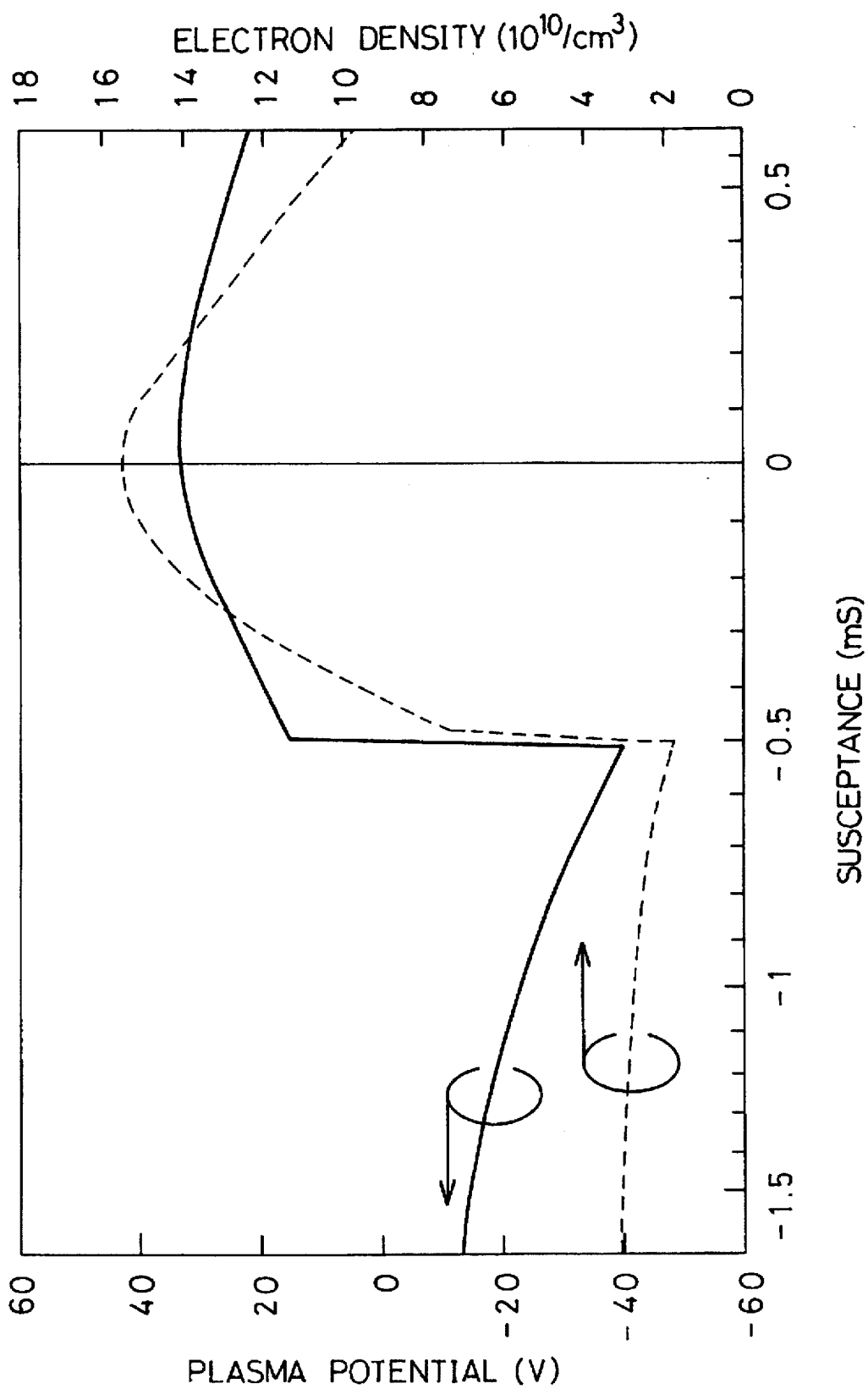
FIG. 13 is a graph showing the results of the measurement of a plasma using a conventional probe having a variable reactance.
Figure 14:
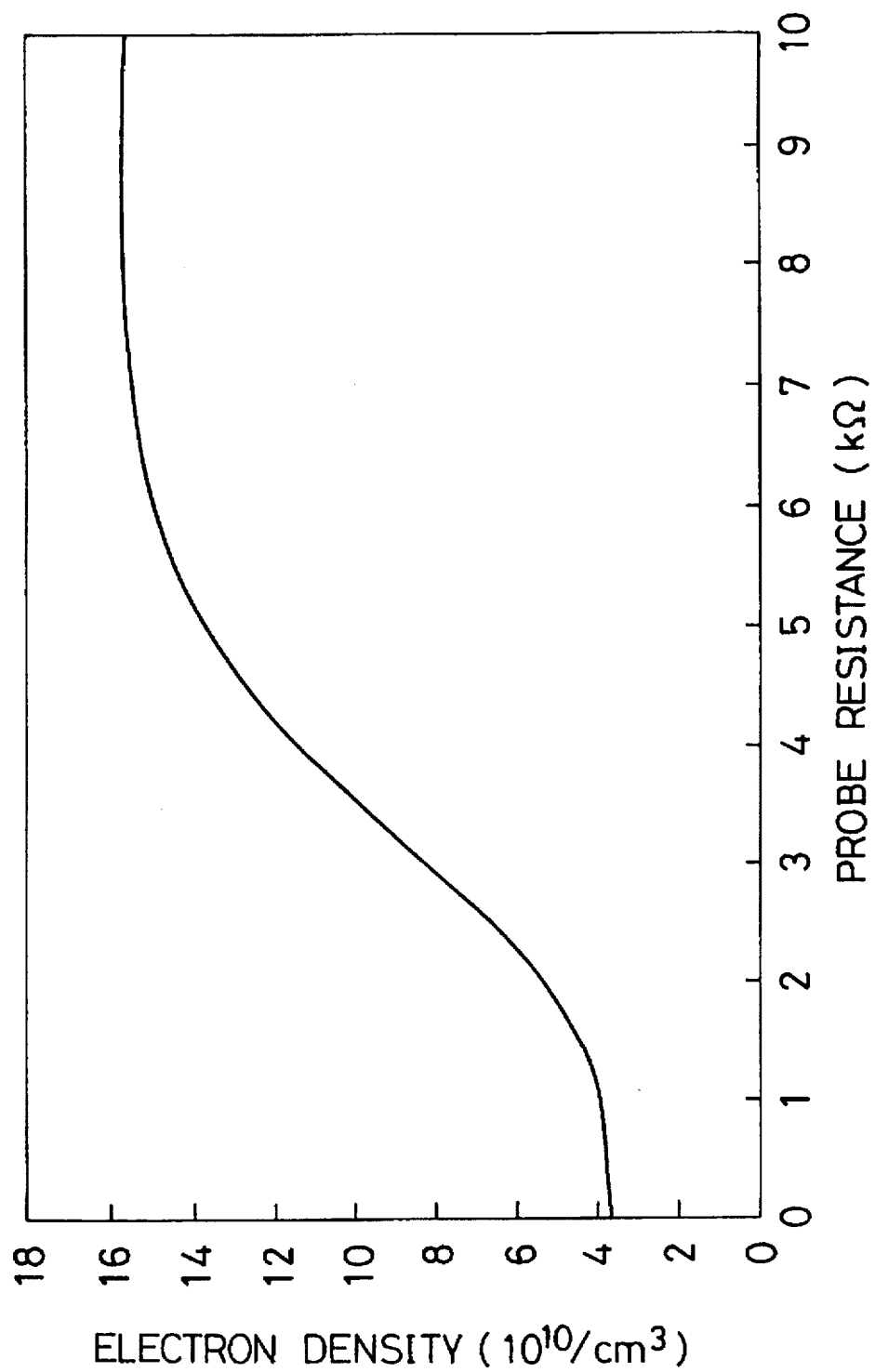
FIG. 14 is a graph showing the results of the measurement of a plasma using a conventional probe having a variable resistance.
Figure 15:
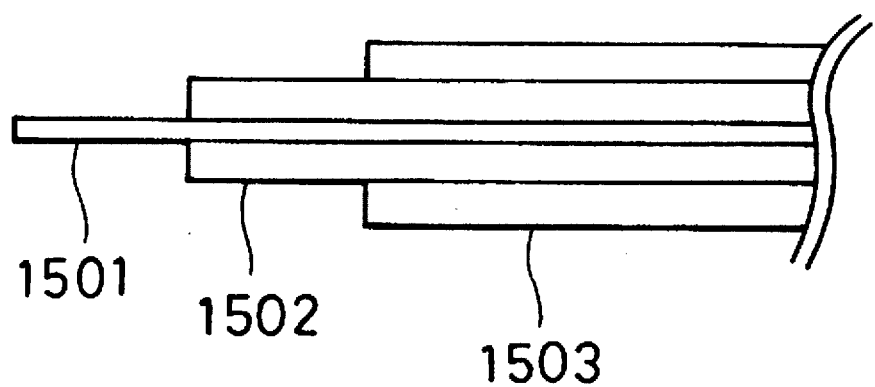
FIG. 15 is a conceptual diagram showing a conventional single probe.

The probes and the conventional probes discussed to this point measure the current/voltage characteristics and extract the values of the plasma parameters from the results of this measurement. The probe of the present embodiment which is shown in FIG. 11 is epoch-making in that it is capable of directly measuring the oscillation waveform and amplitude of the plasma potential.

Reference 1101 indicates an electrode which is disposed within the plasma. This is, for example, a stainless steel mesh having an essentially square shape in which one side measures 28 mm, and in which the wire gap is 0.4 mm and the wire diameter is 0.3 mm. This electrode may, of course, have a freely selected shape, and a metal mesh is not necessarily required. Reference 1102 indicates a resistor, which is connected to electrode 1101 by means of, for example, spot welding and is connected to the core of coaxial cable 1103 by means of, for example, soldering. Reference 1102 is a metal plated resistor of, for example, 450 $\Omega$. Reference 1103 indicates a coaxial cable, one end of which is connected to connector 1106; this is, for example, a semi-rigid coaxial cable in which the outer diameter of the outer conductor is 2.19 mm. Current input terminal 1107 has connectors attached to both ends thereof, and is itself affixed to the chamber wall. Reference 1109 indicates an instrument which is capable of measuring high frequency voltages; this comprises, for example, an oscilloscope in which the input impedance is 50 $\Omega$. It is of course the case that no device is ruled out so long as it is an instrument which is capable of measuring high frequency voltages, such as a sampling oscilloscope, a frequency analyzer, or the like. Measuring instrument 1109 and current input terminal 1107 are connected to a coaxial cable 1108, which has connectors attached to both ends thereof. References 1104 and 1105 indicate insulating tubes; these comprise, for example, ceramic tubes. These are provided in order to isolate the plasma; however, insulating tubes 1105 need not be present.

In order to accurately measure the oscillation waveform of the plasma potential, it is necessary that the potential of electrode 1101 oscillate in such a manner as to be synchronous with and parallel to the plasma potential. For this reason, it is necessary to increase the size of the impedance between electrode 1101 and the ground, and in the probe of the present embodiment a resistor 1102 is provided. Furthermore, the surface area of the electrode 1101 is made comparatively large in view of the necessity of decreasing the sheath impedance.

The end of the core of the coaxial cable 1103 which is on the side of resistor 1102 is the point labeled D in the diagram. Measuring instrument 1109 measures a potential which is equivalent to the potential at the D point. The potential at point D has a value equal to the potential of electrode 1101 divided by resistance 1102 and the impedance when looking into the side of the measuring instrument 1109 from the D point. For example, when the resistance 1102 is 450 $\Omega$, and the impedance when looking into the side of the measuring instrument 1109 from the D point is 50 $\Omega$, then the measuring instrument measures a potential which is $\frac{1}{10}$ the potential of electrode 1101.

Next, a modified example of a probe of the present embodiment will be discussed. In FIG. 11, it is sufficient that coaxial cable 1101 and measuring instrument 1109 be electrically connected; the portion 1106–1108 may have a structure other than that shown in FIG. 11.

Furthermore, when the impedance when looking into the side of the measuring instrument 1109 from point D is capacitive, a capacitor may be employed in place of the resistor 1102. When the length from point D to the measuring instrument 1109 is sufficiently shorter than the wavelength at the excitation frequency, then when a high input impedance measuring instrument 1109 is employed, the impedance when looking into the side of the measuring instrument 1109 from point D is comparatively large and capacitive. In such a case, a capacitor may be used in place of resistor 1102, and the potential of electrode 1101 divided. Furthermore, when a structure is employed such as in the present embodiment in which an oscilloscope is connected and the waveform is determined, then when the impedance when looking into the side of the measuring instrument 1109 from point D is 3 or more times larger than the sheath impedance, point D may be directly connected to electrode 1101.

Furthermore, an impedance variable circuit may be inserted between electrode 1101 and resistor 1102. In an impedance variable circuit, the impedance on the electrode 1101 side, that is to say, the input side, is larger than the impedance on the output side; this is, for example, a voltage follower circuit employing an operational amplifier. In the probe shown in FIG. 11, if the resistance of the resistor 1102 is made too large, then the voltage measured by measuring instrument 1109 will become small, and furthermore, the parasitic capacitance of the resistor itself can no longer be ignored. For this reason, it is impossible to make the impedance of the electrode extremely large. In contrast, in a probe in which an impedance variable circuit is employed, it is possible to increase the size of the electrode in accordance with the input impedance of the variable circuit. This is structurally complex; however, such a probe has advantages in that the accuracy is high, the frequency band is wide, and electrode 1101 can be made smaller.

INDUSTRIAL APPLICABILITY

As described above, by means of the instrument for measuring plasma in accordance with the present invention, the measurement of plasma excited by a high frequency, which was conventionally almost impossible, can be conducted in an accurate and simple manner. That is to say, the measurement of the average potential, the oscillation waveform of the potential, the density of the plasma, and the like becomes possible for the first time, and this is extremely effective in the analysis of plasma excited by high frequencies. In particular, this is effective in process apparatuses used in the formation of various types of thin films, pattern etching, and the like, which employ plasma excited by a high frequency. The most important value in such plasma processes is the energy of the ions irradiated onto the plasma surface which conduct film formation or etching, and the control of this irradiated ion energy at the optimal value in the various processes is a necessary condition for an increase in the quality of the process; by means of accurately measuring the plasma potential, the irradiated ion energy can also be accurately controlled.

We claim:

1. A measuring instrument for measuring all values of a plasma produced by means of a high frequency discharge at a given frequency within a vacuum chamber, said measuring instrument comprising: a wire for electrically connecting a first electrode disposed within a plasma and a terminal disposed outside said vacuum chamber for providing output signals; and an insulator covering at least a portion of a surface of said wire; wherein the absolute value of the impedance at said given frequency between said first electrode and ground via said wire is at least five times the absolute value of the impedance at said given frequency between said first electrode and said plasma in a state in which no direct current flows through said first electrode.

2. A measuring instrument for plasma excited by a high frequency in accordance with claim 1, further comprising a second electrode disposed in said plasma wherein said second electrode and said first electrode are connected via a capacitor.

3. A measuring instrument for plasma excited by a high frequency in accordance with claim 1, further comprising circuitry coupled to said terminal such that the impedance at said given frequency between said terminal and ground via said circuitry is variable.

4. A measuring instrument for plasma excited by a high frequency in accordance with claim 1, wherein at least a portion of said wire comprises a coaxial cable, a length of an outer conductor of said coaxial cable is approximately equivalent to an odd multiple of one-fourth of a wavelength associated with said given frequency, and a core of said coaxial cable and said outer conductor of said coaxial cable are electrically connected via a capacitor at an end of said coaxial cable coupled to said terminal.

5. A measuring instrument for plasma excited by a high frequency in accordance with claim 1, wherein at least a portion of said wire comprises a coaxial cable, a resistor is disposed between said first electrode and a core of said coaxial cable, and a measuring device for measuring the high frequency voltage at said terminal is coupled to said terminal.

* * * * *